United States Patent
Chang et al.

(10) Patent No.: US 8,735,904 B2
(45) Date of Patent: May 27, 2014

(54) SEMICONDUCTOR DEVICE

(75) Inventors: Yi Chang, Hsinchu (TW); Chia-Hua Chang, Taichung (TW); Yueh-Chin Lin, New Taipei (TW); Yu-Kong Chen, New Taipei (TW); Ting-En Shie, Hsinchu (TW)

(73) Assignee: National Chiao Tung University (TW)

( * ) Notice: Subject to any disclaimer, the term of this patent is extended or adjusted under 35 U.S.C. 154(b) by 0 days.

(21) Appl. No.: 13/368,662

(22) Filed: Feb. 8, 2012

(65) Prior Publication Data

US 2012/0313107 A1 Dec. 13, 2012

(30) Foreign Application Priority Data

Jun. 10, 2011 (TW) .............................. 100120365 A

(51) Int. Cl.
*H01L 29/15* (2006.01)
*H01L 21/336* (2006.01)

(52) U.S. Cl.
USPC ............................................ 257/76; 438/197

(58) Field of Classification Search
USPC ............ 257/76, 335, 194, 587, 472; 438/571, 438/605, 586, 597, 602, 607, 608, 610, 612, 438/652, 573
See application file for complete search history.

(56) References Cited

U.S. PATENT DOCUMENTS

| | | | |
|---|---|---|---|
| 2002/0080293 A1* | 6/2002 | Chae | 349/43 |
| 2006/0244084 A1* | 11/2006 | Lee et al. | 257/412 |
| 2007/0052043 A1* | 3/2007 | Cha et al. | 257/412 |
| 2007/0103038 A1* | 5/2007 | Kamijo | 310/364 |
| 2010/0038682 A1* | 2/2010 | Lahreche | 257/194 |
| 2011/0227089 A1* | 9/2011 | Mieczkowski et al. | 257/76 |
| 2012/0313107 A1* | 12/2012 | Chang et al. | 257/76 |

* cited by examiner

*Primary Examiner* — Julio J Maldonado
*Assistant Examiner* — Moin Rahman
(74) *Attorney, Agent, or Firm* — Reed Smith LLP

(57) ABSTRACT

A semiconductor device includes a main body made of a GaN-based semiconductor material, and at least one electrode structure. The electrode structure includes an ohmic contact layer that is formed on the main body, a buffer layer that is formed on the ohmic contact layer opposite to the main body, and a circuit layer that is made of a copper-based material and that is formed on the buffer layer opposite to the ohmic contact layer. The ohmic contact layer is made of a material selected from titanium, aluminum, nickel, and alloys thereof. The buffer layer is made of a material different from the material of the ohmic contact layer and selected from titanium, tungsten, titanium nitride, tungsten nitride, and combinations thereof.

4 Claims, 3 Drawing Sheets

SEMICONDUCTOR DEVICE

CROSS-REFERENCE TO RELATED APPLICATION

This application claims priority of Taiwanese application no. 100120365, filed on Jun. 10, 2011.

BACKGROUND OF THE INVENTION

1. Field of the Invention

The present invention relates to a semiconductor device having a buffer layer that is used to prevent diffusion of copper atoms into a main body.

2. Description of the Related Art

Currently, in the field of manufacturing an integrated circuit having electrical components, such as high electron mobility transistors, gold (Au) and aluminum (Al), both of which have good electrical conductivity, are used as main materials for an electrode structure to electrically connect the respective electrical components in the integrated circuit. Although gold has excellent electrical conductivity and thermal conductivity, it is relatively rare as compared with other metals, such as aluminum, and thus, is relatively expensive. Therefore, in order to minimize the manufacturing cost of the integrated circuit, the amount of gold used for producing the integrated circuit has to be reduced. On the other hand, although aluminum is relatively inexpensive, its electrical conductivity and thermal conductivity are relatively poor compared to gold. Thus, when aluminum is used in an integrated circuit with minimized size, over-heating and high power consumption might occur, thereby resulting in premature degradation of the integrated circuit and insufficient battery endurance.

It is known that copper has high electrical conductivity and good thermal conductivity, and is relatively inexpensive. Thus, it is suitable for use as a main material for an electrode. Therefore, in the field of integrated circuits that use high electron mobility transistors as the main electrical components, introduction of a copper plating process is required for further development.

Referring to FIG. 1, a conventional semiconductor device, e.g., a high electron mobility transistor, includes a substrate 111, a main body 11, a gate structure 12, and two electrode structures 13.

The main body 11 is formed on the substrate 111, and includes a first film layer 112 that is mainly made of gallium nitride, and a second film layer 113 that is mainly made of aluminum gallium nitride.

The gate structure 12 is formed on an upper surface of the second film layer 113 of the main body 11 that is opposite to the first film layer 112, and is made of a conductive material, e.g., a metal.

The electrode structures 13 are formed on the upper surface of the second film layer 113 and are spaced apart from the gate structure 12, and include an ohmic contact layer 131 and a circuit layer 132. The ohmic contact layer 131 is made of an alloy consisting essentially of titanium, aluminum, and nickel. The circuit layer 132 is mainly made of copper and is adapted to be welded with wires so as to electrically connect to an external circuit.

The channel is formed in the top of the second film layer 113 in the main body 11. One of the electrode structures 13 serves as a drain, and the other one of the electrode structures 13 serves as a source. Further, the gate structure 12 serves as a gate.

Under an ideal state, when a voltage is applied to the gate and the drain from the external circuit through the wires, voltage differences are formed between the gate and the main body 11 and between the drain and the source. At this time, a current may flow from the drain to the source through the channel so that the semiconductor device may be actuated.

However, because copper has great activity, when the electrode structures 13 of the semiconductor device are manufactured and/or are actuated, the copper atoms of the circuit layer 132 are liable to pass through the ohmic contact layer 131 and diffuse into the second film layer 113 and even the first film layer 112 of the main body 11, thereby resulting in poor electrical properties and inferior reliability of the semiconductor device.

SUMMARY OF THE INVENTION

Therefore, the object of the present invention is to provide a semiconductor device that has high reliability.

Accordingly, a semiconductor device of the present invention comprises a main body made of a GaN-based semiconductor material, and at least one electrode structure adapted to be connected to an external circuit The electrode structure includes an ohmic contact layer that is formed on the main body, a buffer layer that is formed on the ohmic contact layer opposite to the main body, and a circuit layer that is made of a copper-based material and that is formed on the buffer layer opposite to the ohmic contact layer. The ohmic contact layer is made of a material selected from the group consisting of titanium, aluminum, nickel, and alloys thereof. The buffer layer is made of a material different from the material of the ohmic contact layer and selected from the group consisting of titanium, tungsten, titanium nitride, tungsten nitride, and combinations thereof.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
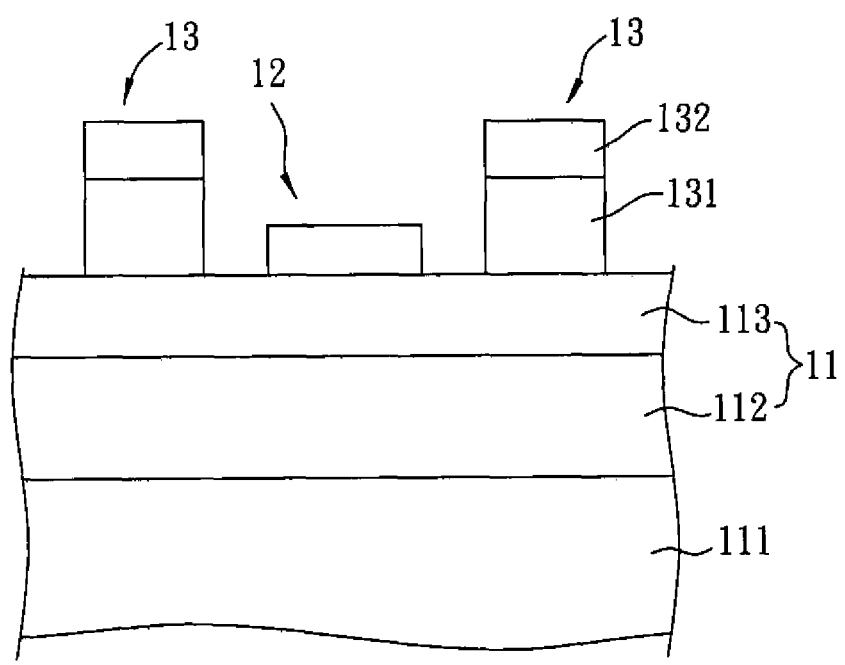
FIG. 1 is a fragmentary schematic view of a conventional semiconductor device.
Figure 2:
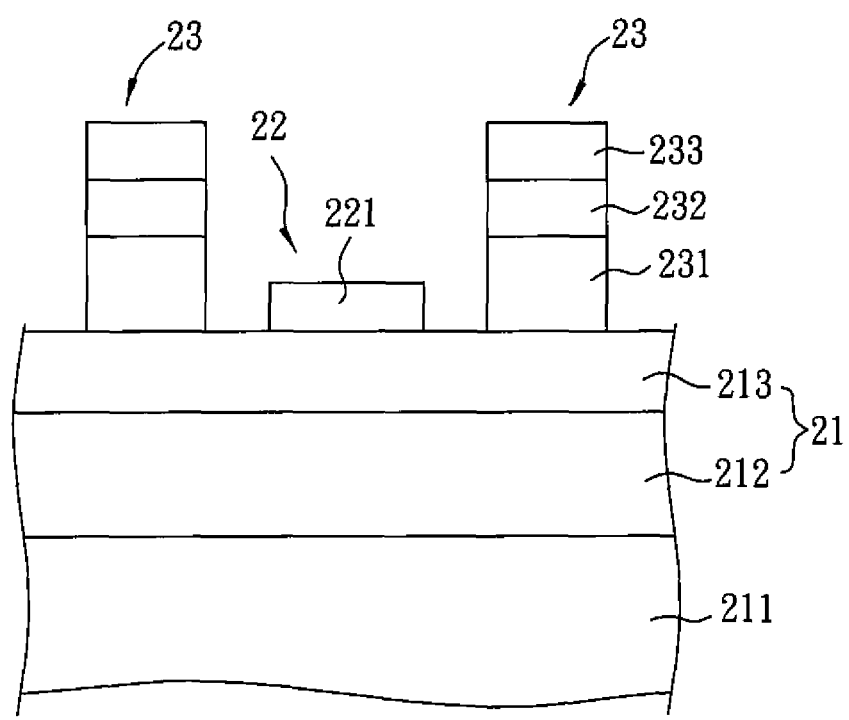
FIG. 2 is a fragmentary schematic view of the preferred embodiment of a semiconductor device according to the present invention.

Referring to FIG. 2, the preferred embodiment of a semiconductor device of this invention comprises a substrate 211, a main body 21, a gate structure 22, and two electrode structures 23.

The main body 21 is formed on the substrate 211, and includes a first film layer 212 that is mainly made of gallium nitride (GaN), and a second film layer 213 that is formed on the first film layer 212 opposite to the substrate 211 and that is mainly made of aluminum gallium nitride (AlGaN). Since gallium nitride and aluminum gallium nitride constituting the main body 21 are all semiconductor materials, the main body 21 exhibits semiconductor properties.

The gate structure 22 is formed on a top surface of the second film layer 213 of the main body 21 opposite to the first film layer 212. Since, in this embodiment, the semiconductor device is a high electron mobility transistor, the gate structure 22 includes a gate electrode layer 221 that is made of a conductive material and that is formed on and contacts the top surface of the second film layer 213. It is noted that the gate structure 22 may be slightly modified depending upon the type of the transistor. For example, the gate structure 22 may further include a dielectric member (not shown) that is made of an insulating material, and the gate electrode layer 221 is spaced apart from the main body 21 through the dielectric member.

The electrode structures 23 are also separately formed on the top surface of the second film layer 213 of the main body 21, and are separated respectively from the gate structure 22. In FIG. 2, the electrode structures 23 and the gate structure 22 are arranged in the following order: one of the electrode structures 23, the gate structure 22, and the other one of the electrode structures 23. Each of the electrode structures 23 includes an ohmic contact layer 231 that is formed on the top surface of the second film layer 213 of the main body 21, a buffer layer 232 that is formed on the ohmic contact layer 231 opposite to the main body 21, and a circuit layer 233 that is formed on the buffer layer 232 opposite to the ohmic contact layer 231.

The ohmic contact layer 231 is made of a material selected from the group consisting of titanium, aluminum, nickel, and alloys thereof. In an example of this invention, the ohmic contact layer 231 is formed by sputtering or vapor depositing titanium, aluminum, and nickel on the top surface of the second film layer 213, followed by annealing at an elevated temperature. In this way, the second film layer 213 is in ohmic contact with the ohmic contact layer 231. Preferably, the ohmic contact layer 231 is made of alloy. When the thickness of the ohmic contact layer 231 is too small, current may not flow smoothly in the ohmic contact layer 231 and resistance will be high. On the other hand, when the thickness of the ohmic contact layer 231 is too large, the ohmic contact layer 231 cannot have a preferred alloy ratio during annealing in a high temperature furnace tube, and low resistance still cannot be achieved. Therefore, the ohmic contact layer 231 preferably has a thickness ranging from 165 nm to 330 nm. The ohmic contact layer 231 is used to form a current transmission path with low resistance.

The buffer layer 232 is made of a material different from the material of the ohmic contact layer 231 and selected from the group consisting of titanium, tungsten, titanium nitride, tungsten nitride, and combinations thereof. In the example of this invention, the buffer layer 232 is made of titanium and is formed on the ohmic contact layer 231 by a sputtering process, a vapor deposition process, or a chemical vapor deposition process. Preferably, the buffer layer 232 has a thickness ranging from 10 nm to 30 nm.

The circuit layer 233 is connected to a surface of the buffer layer 232 and is adapted to be electrically connected to an external circuit to receive electric power from the external circuit. The circuit layer 233 is mainly made of copper so as to obtain good electrical conductivity and ensure the electrical connection to the external circuit. Preferably, the circuit layer 233 has a thickness ranging from 50 nm to 150 nm so as to obtain better electrical transmission efficiency in cooperation with the main body 21, the ohmic contact layer 231, and the buffer layer 232.

The main body 21, the gate structure 22, and the two electrode structures 23 may form a transistor having high electron mobility in the semiconductor device. The channel is formed in the top of the second film layer 213. One of the electrode structures 23 serves as a drain, and the other one of the electrode structures 23 serves as a source. Further, the gate structure 22 serves as a gate.

When a predetermined voltage is applied to the gate structure 22 and one of the electrode structures 23, predetermined voltage differences are formed between the gate and the main body 21 and between the drain and the source. At this time, current may flow from the drain to the source through the channel in the second film layer 213 of the main body 21 so that the semiconductor device may be operated normally in an ON state. When there is no voltage difference between the gate and the main body 21 or between the drain and the source, the semiconductor device is in an OFF state.

With the buffer layer 232, copper atoms of the circuit layer 233 are prevented from diffusing into the main body 21 when the semiconductor device is in an ON or OFF state. Therefore, the semiconductor properties of the main body 21 could be maintained, and the data, such as the current value, the required power, the equivalent resistance, and the electrical conductivity of the electrical components of the semiconductor device may be accurately calculated when the semiconductor device is in an ON state. Accordingly, the semiconductor device of this invention exhibits high reliability.

Example

First, a first film layer 212 that is made of gallium nitride was formed on a substrate 211, and a second film layer 213 that is made of aluminum gallium nitride was formed on a top surface of the first film layer 212, followed by forming a gate structure 22 on a top surface of the second film layer 213. Next, a photoresist layer (not shown) was formed to cover the top surface of the second film layer 213 and the gate structure, and was patterned to have two through holes exposing two portions of the top surface of the second film layer 214. Then, 20 nm of titanium, 25 nm of aluminum, and 120 nm of nickel were deposited in sequence on the two exposed portions of the top surface of, the second film layer 213 by a sputtering process. The titanium, aluminum, and nickel were then annealed in a high temperature furnace tube at a temperature of 800° C. to form an alloy that constitutes an ohmic contact layer 231 having a thickness of 165 nm. Thereafter, a buffer layer 232 that is mainly made of titanium was formed on a top surface of the ohmic contact layer 231 using a sputtering process. A circuit layer 233 made of copper was formed on a top surface of the buffer layer 232 using a sputtering process, thereby forming two spaced electrode structures 23 that serve as a drain and a source of a transistor. Finally, the photoresist layer and metal layers formed thereon were removed using a liftoff process. Thus, a semiconductor device of the present invention was obtained.

Comparative Example

First, a first film layer that is made of gallium nitride was formed on a substrate, and a second film layer that is made of aluminum gallium nitride was formed on a top surface of the first film layer, followed by forming a gate structure on a top surface of the second film layer. Next, an ohmic contact layer and a circuit layer, which are made of the same materials as those in the aforesaid Example, were formed on the top surface of the second film layer in a manner similar to that of the abovementioned Example. Thus, a semiconductor device for Comparative example is obtained.

<Reliability Test>

To determine reliability of the semiconductor devices for both Example and Comparative example, the semiconductor devices were placed in a high temperature furnace tube to conduct a baking process at 800° C., that is higher than an actuation temperature (500° C.) for a general semiconductor device, for 10 minutes.

Next, ohmic contact properties of the semiconductor devices for both Example and Comparative example were measured by virtue of a transmission line measurement (TLM) method to determine the reliability of the semiconductor devices.

More specifically, in each of the semiconductor devices for both Example and Comparative example, the positive pole of a direct current power supply was electrically connected to one of the electrode structures, and the negative pole of the power supply was electrically connected to the other one of the electrode structures. When a predetermined voltage was applied to the semiconductor device from the power supply, the two electrode structures serve as two resistors, and the second film layer located between the two electrode structures serves as another resistor. In this manner, three resistors, i.e., an equivalent resistor formed by one of the electrode structures, an equivalent resistor formed by the second film layer located between the electrode structures, and an equivalent resistor formed by the other one of the electrode structures, were connected in series to form an equivalent circuit. Since the two electrode structures are the same, the equivalent resistance of the electrode structures may be calculated if the resistance of the second film layer is available.

After the connection to the power supply was completed, the length of the second film layer located between the electrode structures was changed and the variations of the total resistance of the three resistors were measured. Thus, the ratio of the resistivity to the cross-sectional area of the second film layer could be obtained. Next, by virtue of the resistance definition, that is, the resistance is proportional to the length of an object ($R=\rho(l/A)$) when the ratio of the resistivity to the cross-sectional area of the object is fixed, the sum of the equivalent resistances of the electrode structures may be calculated by subtracting the equivalent resistance of the second film layer from the total resistance of the three resistors. If the second film layer is not doped with copper atoms, the equivalent resistance of the second film layer may be considered as a general impedance and the ratio of the resistivity to the cross-sectional area is fixed. If the copper atoms diffuse into the second film layer, the ratio of the resistivity to the cross-sectional area is unstable and the resistivity is increased rapidly as the length of the second film layer is increased.

Figure 3:
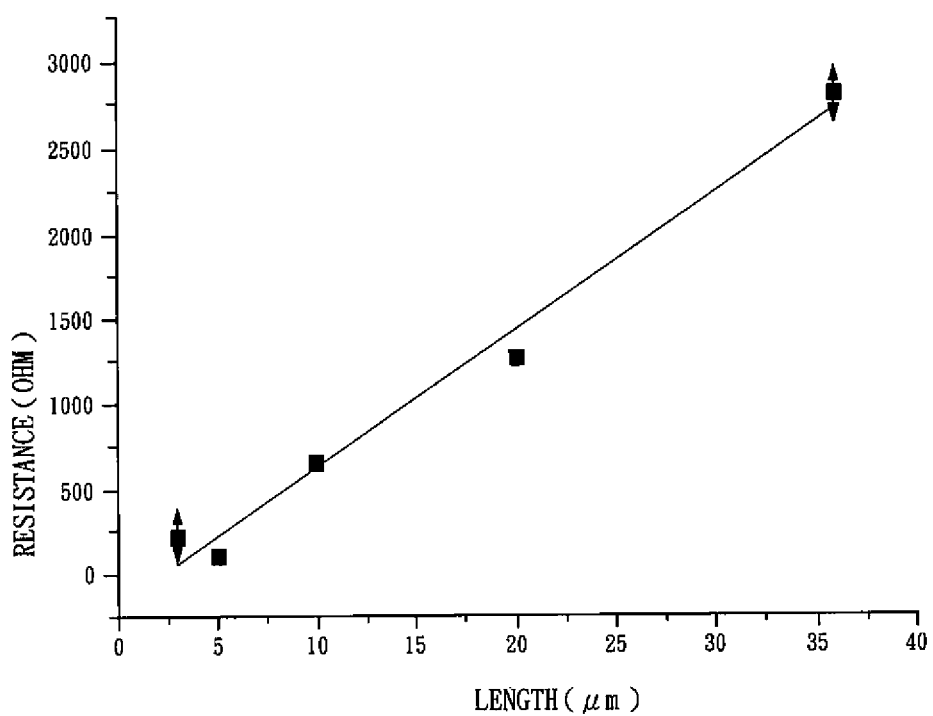
FIG. 3 is plot showing transmission line measurement results for the semiconductor devices of an example of the present invention.

Referring to FIG. 3, when the length of the second film layer 213 of the example of this invention is changed, the profile of the measured resistance is generally an inclined line, that is to say, the resistivity is proportional to the length of the example of the semiconductor device of the present invention without rapid change. The contact resistance of the electrode structures 23 is maintained at $7\times10^{-5}$ $\Omega cm^2$, which means the abovementioned example has good reliability.

It is noted that, although the preferred embodiment of the semiconductor device of the present invention has one transistor, the semiconductor device of the present invention may comprise a plurality of electrode structures and/or gate structures to form a plurality of transistors in other embodiment. If the semiconductor device of the present invention comprises a plurality of electrode structures, it may be formed as various types of transistors, or capacitors, resistors and the like.

To sum up, with the buffer layer 232, diffusion of copper atoms of the circuit layer 233 into the main body 21 could be alleviated or eliminated, and thus, the semiconductor device of this invention can have superior reliability.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A semiconductor device comprising:
   a main body made of a GaN-based semiconductor material; and
   at least one electrode structure which is adapted to be connected to an external circuit, which is disposed on said main body to ohmic-contact therewith, and which includes:
      an ohmic contact layer that is formed on said main body,
      a buffer layer that is formed on said ohmic contact layer opposite to said main body, and
      a circuit layer that is made of a copper-based material and that is in direct contact with said buffer layer opposite to said ohmic contact layer,
      said ohmic contact layer being made of an alloy including titanium, aluminum, and nickel,
      said buffer layer being made of titanium.

2. The semiconductor device of claim 1, which comprises two of said electrode structures, and which further comprises a gate electrode layer that is made of a conductive material and that is formed on said main body and is separated from said electrode structures.

3. The semiconductor device of claim 2, wherein said ohmic contact layer has a thickness ranging from 165 nm to 330 nm, said buffer layer has a thickness ranging from 10 nm to 30 nm, and said circuit layer is made of copper and has a thickness ranging from 50 nm to 150 nm.

4. The semiconductor device of claim 3, wherein said main body includes a first film layer that is mainly made of gallium nitride, and a second film layer that is formed on said first film layer to make ohmic contact with said ohmic contact layer, and that is mainly made of aluminum gallium nitride.

* * * * *